US007825016B2

(12) United States Patent
Giles

(10) Patent No.: US 7,825,016 B2
(45) Date of Patent: Nov. 2, 2010

(54) METHOD OF PRODUCING A SEMICONDUCTOR ELEMENT

(75) Inventor: Luis-Felipe Giles, Munich (DE)

(73) Assignee: Infineon Technologies AG (DE)

( * ) Notice: Subject to any disclaimer, the term of this patent is extended or adjusted under 35 U.S.C. 154(b) by 964 days.

(21) Appl. No.: 11/559,557

(22) Filed: Nov. 14, 2006

(65) Prior Publication Data
US 2007/0161219 A1   Jul. 12, 2007

(30) Foreign Application Priority Data
Nov. 14, 2005   (DE)   ........................ 10 2005 054 218

(51) Int. Cl.
*H01L 21/425* (2006.01)
(52) U.S. Cl. ........................ 438/528; 438/162; 438/407; 438/527; 438/529; 438/530; 438/532
(58) Field of Classification Search ................. 438/162, 438/407, 527, 528, 529, 530, 532
See application file for complete search history.

(56) References Cited

U.S. PATENT DOCUMENTS

| | | | |
|---|---|---|---|
| 5,374,564 A | | 12/1994 | Bruel |
| 5,900,652 A * | | 5/1999 | Battaglia et al. ............. 257/135 |
| 6,103,597 A * | | 8/2000 | Aspar et al. .................. 438/458 |
| 6,316,333 B1 * | | 11/2001 | Bruel et al. .................. 438/458 |
| 6,333,532 B1 | | 12/2001 | Davari et al. |
| 6,828,632 B2 * | | 12/2004 | Bhattacharyya ............. 257/347 |
| 6,929,984 B2 * | | 8/2005 | Forbes et al. ................ 438/143 |
| 7,494,906 B2 * | | 2/2009 | Kammler et al. ............. 438/528 |
| 7,605,443 B2 * | | 10/2009 | Ogura ........................ 257/522 |
| 2003/0219954 A1 * | | 11/2003 | Baba ........................... 438/373 |
| 2005/0003604 A1 * | | 1/2005 | Dokumaci et al. ........... 438/231 |
| 2005/0023613 A1 * | | 2/2005 | Bhattacharyya ............. 257/348 |
| 2005/0029683 A1 * | | 2/2005 | Forbes et al. ................ 257/913 |
| 2005/0176222 A1 | | 8/2005 | Ogura |

FOREIGN PATENT DOCUMENTS

EP   1 365 447 A2   11/2003

OTHER PUBLICATIONS

L.F. Giles et al.; "Transient enhanced diffusion of B at low temperatures under extrinsic conditions"; Solid State Electronics vol. 49, 2005, pp. 618-627.
B. Colombeau et al.; "Electrical Deactivation and Diffusion of Boron in Preamorphized Ultrashallow Junctions: Interstitial Transport and F co-implant Control"; IEDM 2004, pp. 971-974.
G. Mannino et al; "Electrical activation of B in the presence of boron-interstitials clusters"; Applied Physics Letters, vol. 79, No. 23, Dec. 3, 2001, pp. 3764-3766.

(Continued)

*Primary Examiner*—Kevin M Picardat
*Assistant Examiner*—Bac H Au
(74) *Attorney, Agent, or Firm*—Dickstein, Shapiro LLP

(57) ABSTRACT

In a method for fabricating a semiconductor element in a substrate, micro-cavities are formed in the substrate. Furthermore, doping atoms are implanted into the substrate, whereby crystal defects are produced in the substrate. The substrate is heated, so that at least some of the crystal defects are eliminated using the micro-cavities, and the semiconductor element is formed using the doping atoms.

26 Claims, 13 Drawing Sheets

OTHER PUBLICATIONS

L.F. Giles et al; "Coarsening of End-of-Range defects in ion-implanted silicon annealed in neutral and oxidizing ambients"; Nuclear Instruments and Methods in Physics Research B, vol. 148, 1999, pp. 273-278.

F. Cristiano et al.; "Formation energies and relative stability of perfect and faulted dislocation loops in silicon"; Journal of Applied Physics, vol. 87, No. 12, Jun. 15, 2000, pp. 8420-8428.

B. Colombeau et al.; "Depth dependence of defect evolution and TED during annealing"; Nuclear Instruments and Methods in Physics Research B, vol. 216, 2004, pp. 90-94.

Meng Chen et al.; "Dose-energy match for the formation of high-integrity buried oxide layers in low-dose separation-by-implantation-of-oxygen materials"; Applied Physics Letters, vol. 80, No. 5, Feb. 4, 2002, pp. 880-882.

V. Raineri et al.; "Silicon-on-insulator produced by helium implantation and thermal oxidation"; Applied Physics Letters, vol. 66, Jun. 26, 1995, pp. 3654-3656.

T. Ghani et al.; "A 90nm High Volume Manufacturing Logic Technology Featuring Novel 45nm Gate Length Strained Silicon CMOS Transistors"; Portland Technology Development. 2003 IEEE.

Yasuo Takahashi et al.; "Counter-oxidatiion of superficial Si in single-crystalline Si on $SiO_2$ structure"; Applied Physics Letters, vol. 65, Dec. 5, 1994, pp. 2987-2989.

K. Ota et al.; "Novel Locally Strained Channel Technique for High Performance 55nm CMOS"; 2002, IEEE.

S. Pidin et al.; "A Novel Strain Enhanced CMOS Architecture Using Selectively Deposited High Tensile and High Compressive Silicon Nitride Films"; 2004, IEEE.

A. Shimizu et al.; "Local Mechanical-Stress Control (LMC): A New Technique for CMOS-Performance Enhancement"; 2001, IEEE.

R. Scholz et al.; "Void formation at the interface of bonded hydrogen-terminated (100) silicon wafers"; To be presented at MSM XI, Microscopy of Semiconducting Materials, Oxford 1999.

B. Aspar et al.; "Basic mechanisms involved in the Smart-Cut process"; Microelectronic Engineering, vol. 36, 1997, pp. 233-240.

* cited by examiner

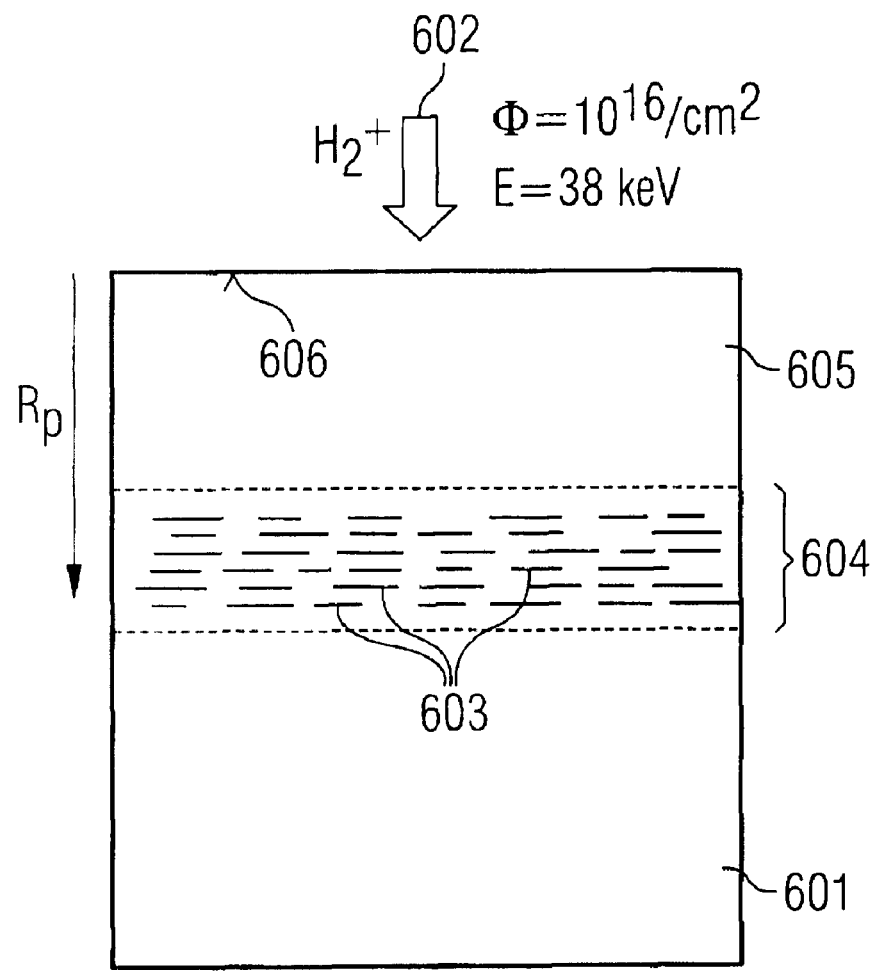

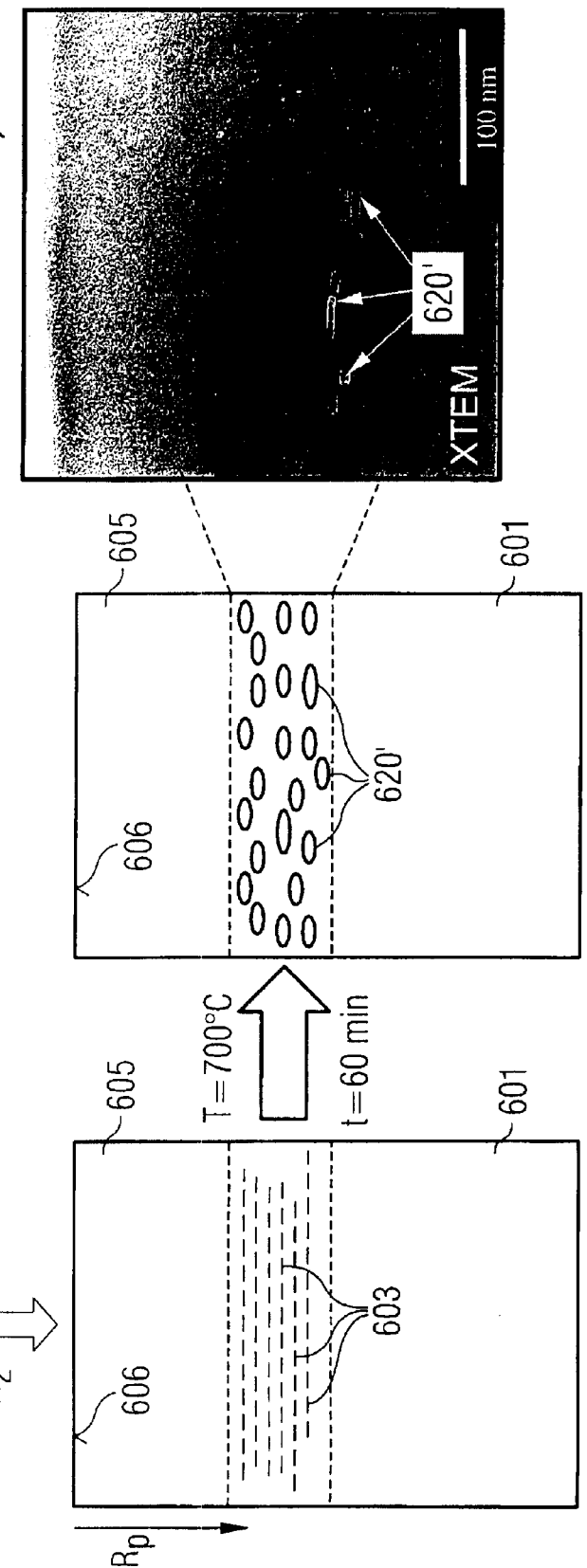

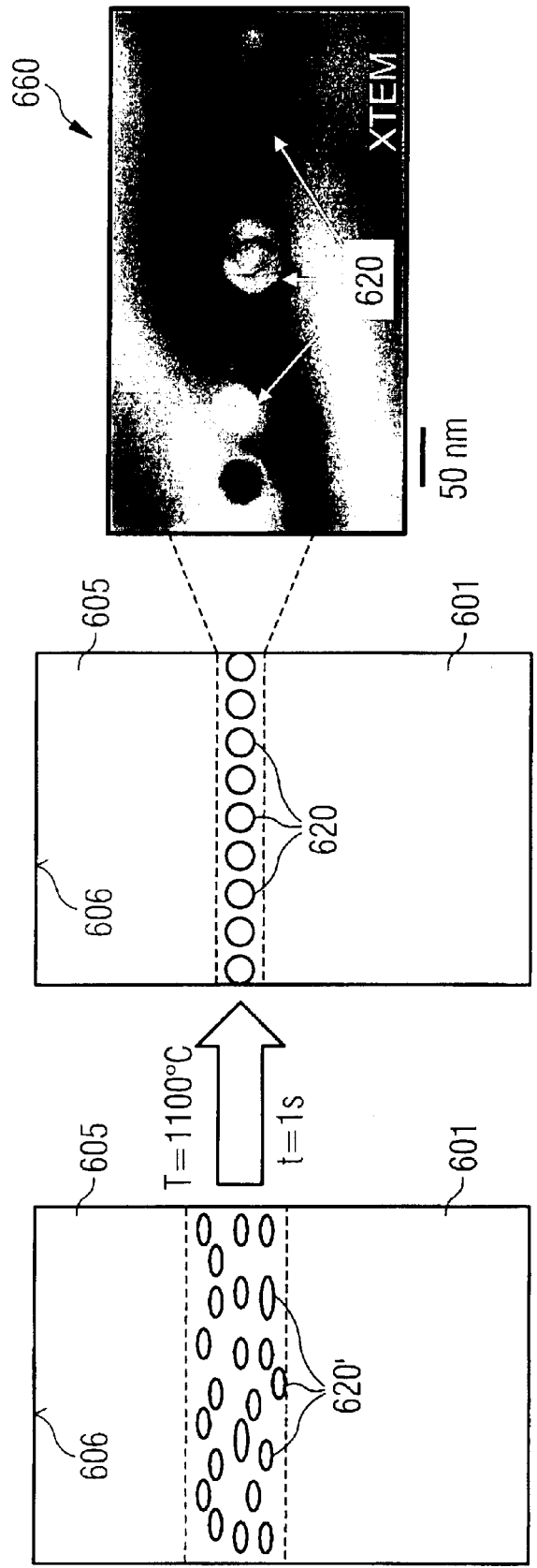

Platelet-like defect distribution

As-implanted sample
($1.3 \times 10^{16} H_2^+/cm^2$, 120 keV)
Mean Platelet length: 6.5 nm
standard deviation: 2.3 nm

METHOD OF PRODUCING A SEMICONDUCTOR ELEMENT

CROSS-REFERENCE TO RELATED APPLICATION

This application claims priority to German Patent Application Serial No. 10 2005 054 218.2, which was filed Nov. 14, 2005, and is incorporated herein by reference in its entirety.

BACKGROUND OF THE INVENTION

The invention relates to a method for fabricating a semiconductor element, and to a semiconductor element.

It is desirable to reduce the number of crystal lattice defects in semiconductor elements.

BRIEF DESCRIPTION OF THE FIGURES

Exemplary embodiments of the invention are illustrated in the figures and are explained in more detail below. In the figures, identical or similar elements, insofar as is expedient, are provided with the same or identical reference symbols. The illustrations shown in the figures are depicted such that they are schematic and therefore not true to scale.

In the figures:

FIG. 6A shows a process step of a method for fabricating a field effect transistor in accordance with one embodiment of the invention;

FIG. 6B shows a further process step of the method for fabricating a field effect transistor in accordance with the embodiment of the invention;

FIG. 6C shows a first XTEM micrograph of micro-cavities;

FIG. 6D shows a further process step of the method for fabricating a field effect transistor in accordance with the embodiment of the invention;

FIG. 6E shows a second XTEM micrograph of micro-cavities;

DESCRIPTION OF THE INVENTION

Figure 1:
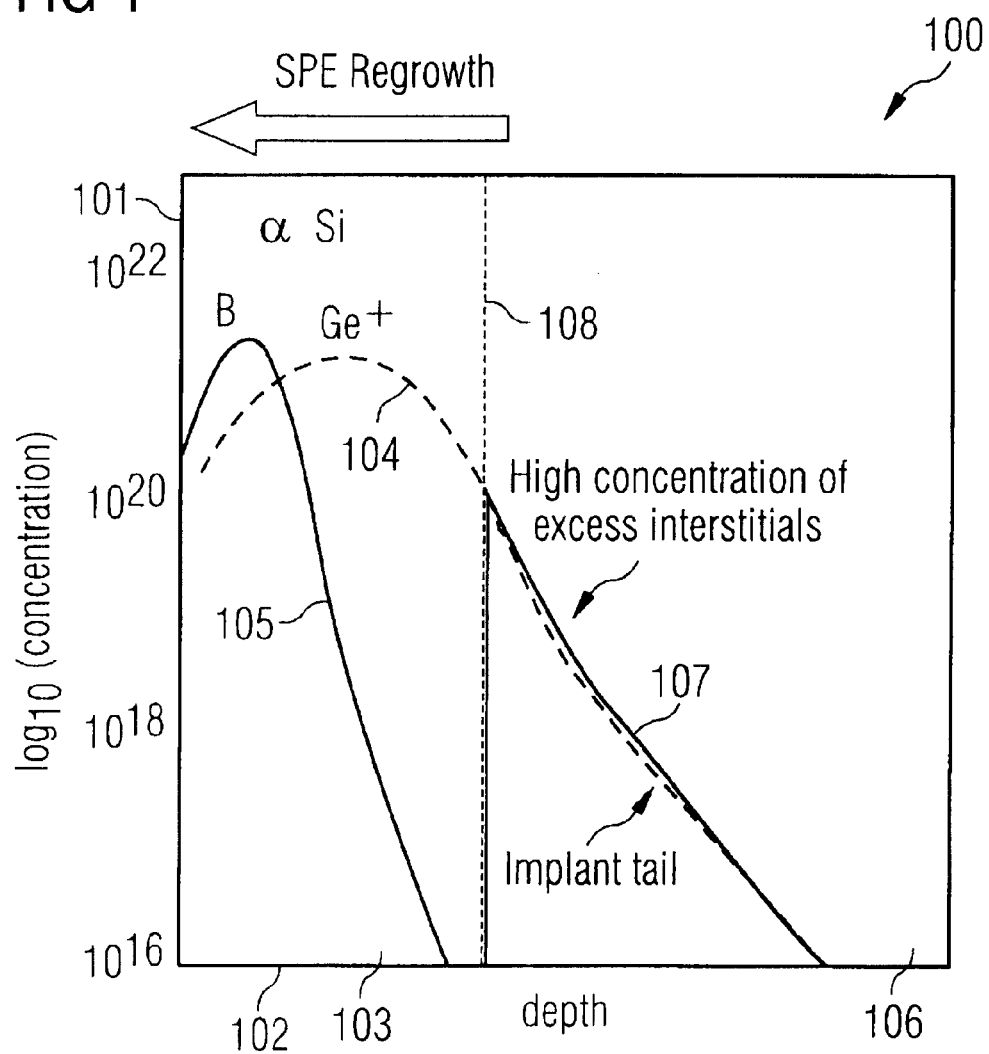
FIG. 1 shows a diagram illustrating a conventional preamorphization of a substrate.

In accordance with the International Technology Roadmap for Semiconductors (ITRS), the 45 nm technology node requires 7 nm deep ultra-shallow junctions having a sheet resistance of less than $1000\Omega/\square$, for example for a transistor.

Conventional technologies for achieving ultra-shallow junctions comprise co-implantation of boron (B), fluorine (F) or carbon (C) into a silicon substrate that has been preamorphized by means of germanium implantation. In order to anneal the implantation damage and to activate the doping atoms, a subsequent high-temperature heating step at a temperature $T \geqq 1300°$ C. using very fast techniques such as, for example, laser heating or flash heating is necessary.

A main disadvantage of these methods can be seen in the deactivation of the doping atoms during the subsequent low-temperature process.

Recently the deactivation mechanism has become better understood, and nowadays it is widely accepted by experts that the deactivation of the doping atoms at low temperatures occurs on account of the formation of immobile dopant interstitial clusters.

The source of interstitials required for forming dopant interstitial clusters can be seen in the end of range (EOR) damages located in the vicinity of the original interface between the amorphous silicon and the crystalline silicon (also referred to as amorphous/crystalline silicon interface).

For these reasons, these interstitial defects are also referred to as end of range (EOR) defects.

Unfortunately, a complete dissolution of EOR defects is not achieved on account of the extremely low thermal budget used in present-day technologies. For this reason, the deactivation of doping atoms is to be regarded as an undesirable side effect of laser heating or flash heating.

Conventionally, an oversaturation of interstitials is a cause of a transient enhanced diffusion (TED) of, for example, boron atoms as doping atoms, and of the deactivation of the boron atoms.

Furthermore, perfect dislocation loops are energetically less stable than Frank dislocation loops. Furthermore, the surface region of a substrate can serve as a sink for interstitials.

Furthermore, EOR defects are very unstable in the vicinity of the substrate surface.

In a conventional method, hydrogen atoms are implanted into a silicon substrate with a dose of more than $10^{16}$ cm$^{-2}$ in a predetermined depth. The implanted hydrogen atoms form cavities in the silicon substrate. The substrate is separated along the cavities extending along a {100}-plane of the silicon substrate, so that a thin silicon layer situated above the cavities is detached from the bulk material by means of a handling wafer applied to the upper surface of the silicon layer.

Embodiments of the invention which are described in connection with the method for fabricating a semiconductor element apply analogously and insofar as is expedient to the semiconductor elements as well, and vice versa.

In a method for fabricating a semiconductor element in accordance with one embodiment of the invention, micro-cavities are formed in a substrate. Furthermore, doping atoms are implanted into the substrate, whereby crystal defects are produced in the substrate. The substrate is heated, so that at least some of the crystal defects are eliminated using the micro-cavities, and the semiconductor element is formed using the doping atoms.

In accordance with another embodiment of the invention, a semiconductor element is provided. The semiconductor element has a substrate with at least one shallow junction in the substrate, the at least one shallow junction having doping atoms. Micro-cavities are formed in the substrate below the at least one shallow junction.

In accordance with one embodiment of the invention, the micro-cavities in the substrate serve as a sink for the crystal defects that occur in the substrate, for example in the context of introducing doping atoms into the crystalline or partly crystalline and partly amorphous substrate, so that the crystal defects can be eliminated.

The micro-cavities formed in the crystal lattice of the substrate are thermally stable, so that they do not disappear even during a high-temperature step at a temperature of more than 1000° C. that is applied to the substrate after the formation of the micro-cavities. This makes it possible, by way of example, for the case where the doping atoms are introduced into the substrate after the high-temperature step, for the micro-cavities to serve as a sink for eliminating the crystal defects produced by the introduction of the doping atoms.

Furthermore, it is possible to reduce or even avoid a transient enhanced diffusion (TED) of the introduced doping atoms, which is usually caused by the crystal defects.

To put it another way, this means that, in accordance with exemplary embodiments of the invention, by means of the elimination of the source of the crystal defects, for example by means of the elimination of the source of end of range (EOR) damages, both TED and the deactivation of the doping atoms, for example of boron atoms, and the junction leakage current are reduced.

In the context of this description, a micro-cavity is to be understood to mean for example a cavity in the substrate with an extent in the micrometers range in all spatial directions, for example with an extent in the micrometers range in one or two spatial directions and with an extent in the nanometers range in one or two spatial directions or with an extent in the nanometers range in all spatial directions. It is thus possible for a micro-cavity to have a width of for example 5 nm to 100 nm or hundreds of nm, for example 10 nm to 100 nm or hundreds of nm, and also a length of 20 nm to 100 nm or hundreds of nm and a height of 10 nm to 100 nm or hundreds of nm, for example approximately 50 nm.

In accordance with another embodiment of the invention, micro-platelets are formed in the substrate and the micro-cavities are formed from the micro-platelets.

In accordance with another embodiment, light ions are implanted into the substrate, so that the micro-cavities are formed in the substrate.

In accordance with another embodiment of the invention, the light ions will be implanted into the substrate, so that the micro-platelets are formed in the substrate.

The introduction of light ions into the substrate in order to form the micro-platelets or micro-cavities constitutes a very simple and reliable mechanism for fabricating the micro-cavities which is process-compatible with present-day CMOS processes (Complementary Metal Oxide Semiconductor). Furthermore, ion implanters are among customary apparatuses in the context of a semiconductor process, so that it is not necessary to fundamentally alter the processes for fabricating the semiconductor element or even to procure new apparatuses.

In accordance with another embodiment of the invention, the micro-platelets are formed by implanting light ions, that is to say ions having a low mass or having a small mass number, to put it another way by light ion implantation. The use of light ions has the advantage, for example, that the covalent bonds in the crystal lattice are broken essentially by ionization.

In accordance with exemplary embodiments of the invention, the following may be used as light ions, by way of example:

hydrogen ions ($H_2^+$ ions) and/or
helium ions ($He^+$ ions) and/or
fluorine ions ($F^+$ ions) and/or
neon ions ($Ne^+$ ions) and/or
chlorine ions ($Cl^+$ ions) and/or
argon ions ($Ar^+$ ions).

The light ions implanted into the substrate clearly have the tendency to break covalent bonds in the substrate (e.g. covalent silicon bonds in a silicon substrate), whereby thin platelets are formed in oversaturated regions. To put it another way, the implantation of light ions results in the production of platelet-like defects or lattice defects in the crystal lattice of the substrate (e.g. in the crystal lattice of a silicon wafer). In this case, the micro-platelets are preferably formed in the vicinity of the maximum or peak of the light ion concentration in the substrate. The depth $R_p$ of the concentration maximum of the implanted light ions is referred to as projected range $R_p$, depth being understood as the distance from the substrate surface. It follows from the above that the concentration of the micro-platelets is also maximal in the vicinity of $R_p$.

The micro-platelets may be elongated along a plane of symmetry of the substrate, depending on the orientation of the substrate surface. By way of example, the platelets may be elongated along the (100) plane in the case of a silicon substrate (silicon wafer) having a (100) surface orientation, and correspondingly along the (111) plane in the case of a (111) substrate (wafer), the length of the micro-platelets (that is to say the extent parallel to the abovementioned plane of symmetry) following a distribution with a mean value and a standard deviation which may depend for example on the implantation dose $\Phi$ and/or on the implantation energy E of the implanted light ions.

The dimensions of the micro-platelets may depend on the implantation conditions (e.g. implantation dose and/or implantation energy) and the conditions during an annealing step. In general, the length and the width of the micro-platelets may be of the order of magnitude of approximately 10 nm, and the height (that is to say the extent perpendicular to the abovementioned plane of symmetry) of the micro-platelets may be of the order of magnitude of approximately 0.54 nm.

By means of the implantation dose $\Phi$ and/or the implantation energy E of the light ions, also the depth and the extent of the region in which the micro-platelets are formed can be influenced. In this context, depth once again means the distance from the substrate surface, and extent means the extent in the direction of the normal to the surface, that is to say the extent along the [100] direction in the case of a (100) substrate.

In other words, in accordance with one embodiment of the invention, by means of varying the two parameters dose $\Phi$ and energy E (and possibly other parameters), it is possible to influence the depth $R_p$ (projected range) of the light ion concentration maximum and consequently the position and/or the extent of the region in which micro-platelets are preferably formed.

With the use of an approximately 10 nm thick screen oxide during an $H_2^+$ ion implantation, a depth or projected range $R_p$ of approximately 100 nm can be achieved for example with an implantation energy E=10 keV and an implantation dose $\Phi=10^{16} H_2/cm^2$, and a depth or projected range $R_p$ of approximately 850 nm can be achieved with an implantation energy E=150 keV and an implantation dose $\Phi=10^{16} H_2/cm^2$.

Another embodiment of the invention provides for the light ions to have an implantation energy of between 10 keV and 150 keV.

In accordance with another embodiment of the invention, the light ions are implanted with a dose of between $10^{15}/cm^2$ and $10^{18}/cm^2$.

Yet another embodiment of the invention provides for an additional mask to be used during the implantation of the light ions. Said mask serves to restrict the lateral extent of the region in which micro-platelets are formed. Clearly, the use of a mask makes it possible to block the implantation of the light ions in predetermined regions of the substrate, so that no micro-platelets are formed in said predetermined regions.

In accordance with another embodiment, a hard mask composed of an oxide material and a nitride material, for example, may be used as the mask.

In accordance with another embodiment of the invention, the micro-cavities may be formed by virtue of a thermal treatment or a heat treatment of the substrate being effected after the formation of the micro-platelets. In other words, the substrate (e.g. the wafer) is tempered or heated; to put it in yet another way, a so-called annealing step is carried out.

In accordance with another embodiment of the invention, the tempering or the process of heat treating, to put it another way the heating, of the substrate (or wafer) may be effected with a low thermal budget. By way of example, the substrate may be heated to a temperature of between 600° C. and 800° C. during the thermal treatment, and the heating may be effected for a duration of between 10 min and 2 h.

In accordance with another embodiment of the invention, the thermal treatment with a low thermal budget may result in an outdiffusion of the implanted light ions from the substrate in the form of neutral atoms or molecules. That is to say that the heating results in the outdiffusion of $H_2$ molecules from the substrate in the case of implanted $H_2^+$ ions, the outdiffusion of He atoms in the case of implanted $He^+$ ions, the outdiffusion of F atoms in the case of implanted $F^+$ ions, etc.

The outdiffusion of the implanted light ions in the form of neutral atoms or molecules leads to the formation of a network or a band, to put it another way a strip-type region, of micro-cavities from the micro-platelets at the range or projected range $R_p$.

Both the size and the density of the micro-cavities formed depend on the process parameters of the method steps described above (light ion implantation with dose $\Phi$ and energy E, thermal treatment with temperature T and duration t). The process parameters can be chosen or optimized such that the density and the size of the micro-cavities in each case remain below predetermined threshold values, so that stripping or delamination of the silicon substrate does not occur. In other words, the density and/or the size of the micro-cavities are small enough such that the cohesion of the substrate is assured and layer splitting is thus avoided.

The use of a low thermal budget during the thermal treatment (low temperature anneal) additionally makes it possible to prevent the micro-cavities formed from being completely resolved.

Another embodiment of the invention provides for a second thermal treatment to be effected after the thermal treatment, in such a way that a conservative ripening process of the micro-cavities is effected, during which a thinner band having larger micro-cavities is formed from the band of micro-cavities. In this context, conservative is understood to mean that the total volume of micro-cavities is maintained during the ripening process. The ripening process causes a large number of relatively small micro-cavities to form a smaller number of larger micro-cavities. This clearly takes place by two or more small micro-cavities "merging together" to form a larger micro-cavity. This process may also be referred to as a coarsening process.

Another embodiment of the invention provides for a thin band, e.g. having a thickness of approximately 20 nm to 100 nm, of micro-cavities to be formed in the course of the ripening process, in which case the micro-cavities may have a size of approximately 40 nm, and the density of the micro-cavities may be approximately $10^{11}$ cm$^{-3}$.

In accordance with another embodiment of the invention, the second thermal treatment is effected in such a way that the substrate is heated to a temperature of between 1000° C. and 1300° C. The heating may be effected for a duration of between 1 µs and 1 s.

The size and the density of the micro-cavities can be controlled by means of the method steps described above. The size of the micro-cavities can scale with the dimensions of the semiconductor element and be correspondingly optimized for predetermined dimensions of the semiconductor element.

In accordance with one embodiment of the invention, the substrate is partially preamorphized, to put it another way the crystal structure of the substrate, which is originally completely crystalline or monocrystalline, for example, is destroyed for example in a region of the substrate near the surface by means of heating and, if appropriate, additional introduction of preamorphization ions.

In accordance with another embodiment of the invention, the substrate is partially preamorphized after the formation of the micro-cavities.

In accordance with another embodiment, the substrate is partially preamorphized using preamorphization ions, for example using germanium ions ($Ge^+$) or silicon ions ($Si^+$).

The doping atoms used may be, in principle, any desired doping atoms, for example boron atoms, phosphorus atoms or arsenic atoms. Furthermore, fluorine atoms or carbon atoms may be used in addition or as an alternative. These atoms may be implanted into the substrate, by way of example.

In accordance with another embodiment of the invention, the boron atoms are implanted into the substrate, for example by introducing elementary boron into the substrate, or by introducing boron fluoride ($BF_2$) into the substrate. As an alternative, boron clusters may be introduced into the substrate.

In accordance with another embodiment of the invention, at least one region in which the doping atoms are implanted into the substrate forms a shallow junction of the semiconductor element, for example an ultra-shallow junction.

In accordance with another embodiment of the invention, the semiconductor element is formed as a transistor, for example as a field effect transistor.

In accordance with this embodiment of the invention, at least one region in which the doping atoms are implanted into the substrate may form a source region or a drain region of the field effect transistor. In this context, precisely in future technology nodes, during the formation of ultra-shallow junctions as source region or as drain region, the problem arises of interstitials produced in the vicinity of the interface of the amorphous region and the crystalline region of the substrate and—caused by this—increased diffusion of the doping atoms from the source region or drain region into the substrate, which is reduced for example by the provision of the micro-cavities, since the micro-cavities clearly serve as a sink for the interstitials, whereby the diffusion of the doping atoms that occurs is reduced.

Consequently, a first region in which the doping atoms are implanted into the substrate may form a source region, and a second region in which the doping atoms are implanted into the substrate may form a drain region of the field effect transistor.

In accordance with one embodiment of the invention, a silicon substrate, for example a (100)-silicon substrate or a (111)-silicon substrate, is used as the substrate.

In accordance with another embodiment of the invention, in the context of the fabrication of a field effect transistor, the gate insulator or the gate dielectric of the field effect transistor is formed, for example in the form of a gate oxide layer on the channel region of the field effect transistor to be formed, after the formation of the micro-cavities.

In accordance with another embodiment of the invention, the semiconductor element is configured as a transistor, for example as a field effect transistor, the at least one shallow junction forming the source region or the drain region of the field effect transistor.

In accordance with another embodiment of the invention, the shallow junction is arranged in an amorphous region of the substrate.

In accordance with one embodiment of the invention, the doping atoms are boron atoms, phosphorus atoms or arsenic atoms. Furthermore, fluorine atoms or carbon atoms may be used in addition or as an alternative.

Another embodiment of the invention provides a method for fabricating a semiconductor element in a substrate. During the method, micro-cavities are formed in the substrate, the micro-cavities being formed by means of the implantation of light ions into the substrate. Furthermore, during the method, doping atoms are implanted into the substrate, whereby crystal defects are produced in the substrate. Furthermore, during the method, the substrate is heated, so that at least some of the crystal defects are eliminated using the micro-cavities. Furthermore, during the method, the semiconductor element is formed using the doping atoms.

Another embodiment of the invention provides a semiconductor element. The semiconductor element has a substrate, which is formed as a silicon substrate. Furthermore, the semiconductor element has at least one shallow junction in the substrate, the at least one shallow junction being arranged in an amorphous region of the substrate. Furthermore, the semiconductor element has doping atoms in the shallow junction. Furthermore, the semiconductor element has micro-cavities in the substrate below the at least one shallow junction.

Another embodiment of the invention provides a semiconductor element having fewer crystal lattice defects.

FIG. 1 shows, in a first diagram 100, an ion concentration represented along the ordinate 101 (in a logarithmic representation ($\log_{10}$)) in a substrate as a function of the depth into the substrate, represented along the abscissa 102, the main processing surface of the substrate being represented by a straight line running on the ordinate 101 of the diagram 100.

It is assumed in the diagram 100 that a surface region 103 of the substrate is preamorphized using germanium ions ($Ge^+$) (the concentration profile of the germanium ions is represented in a first curve 104 in the diagram 100). It is furthermore assumed that after preamorphization has been effected, boron atoms (B) are implanted into the substrate, for example by means of introducing elemental boron atoms or boron fluoride ($BF_2$) (the concentration profile of the boron atoms is represented in a second curve 105 in the diagram 100). As can be gathered from FIG. 1, the germanium ions are implanted in such a way that they are contained both in the amorphized region 103 of the substrate and in a crystalline region 106 of the substrate. In the context of introducing the germanium ions into the crystalline region 106 of the substrate, crystal lattice damages (also referred to as crystal lattice defects) are produced there. Inter alia, crystal lattice damages in the form of so-called interstitial defects (interstitials), (symbolized by means of a third curve 107 in FIG. 1) consequently arise as a result of the implantation of the germanium ions in the crystalline region 106 of the substrate.

Figure 2:
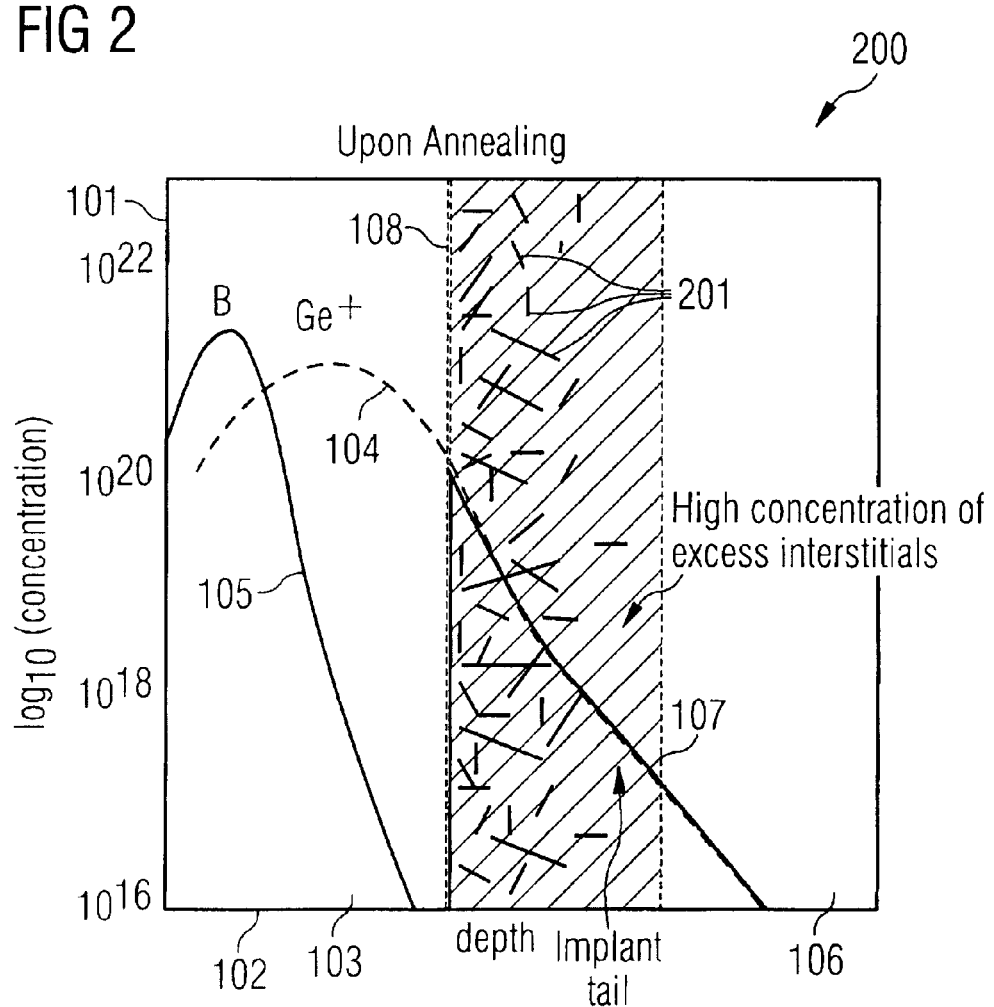
FIG. 2 shows a diagram illustrating a heating of the preamorphized substrate illustrated in FIG. 1 and a formation of interstitials that usually results from this.

If a process is subsequently carried out at a temperature of around 600° C. to 700° C. in order to enable recrystallization of a partial region of the previously amorphized region 103 in the context of Solid Phase Epitaxial Regrowth (SPER), although some of the interstitial defects (interstitials) are annealed, not all the interstitial defects (interstitials) are annealed. So-called end of range interstitial defects 201 (end of range defects, EOR defects), remain primarily in the boundary region at the interface 108 between the amorphous region 103 and the crystalline region 106 (cf. second diagram 200 in FIG. 2).

It should be pointed out that the interstitial defects 201 constitute a cause of a transient enhanced diffusion (TED) of boron atoms, and furthermore a cause of an undesirable deactivation of the boron atoms. Consequently, the deactivation of the boron atoms and also the TED caused constitute a consequence of one driving mechanism, namely an oversaturation of crystal lattice defects produced by means of implantation.

Figure 3:
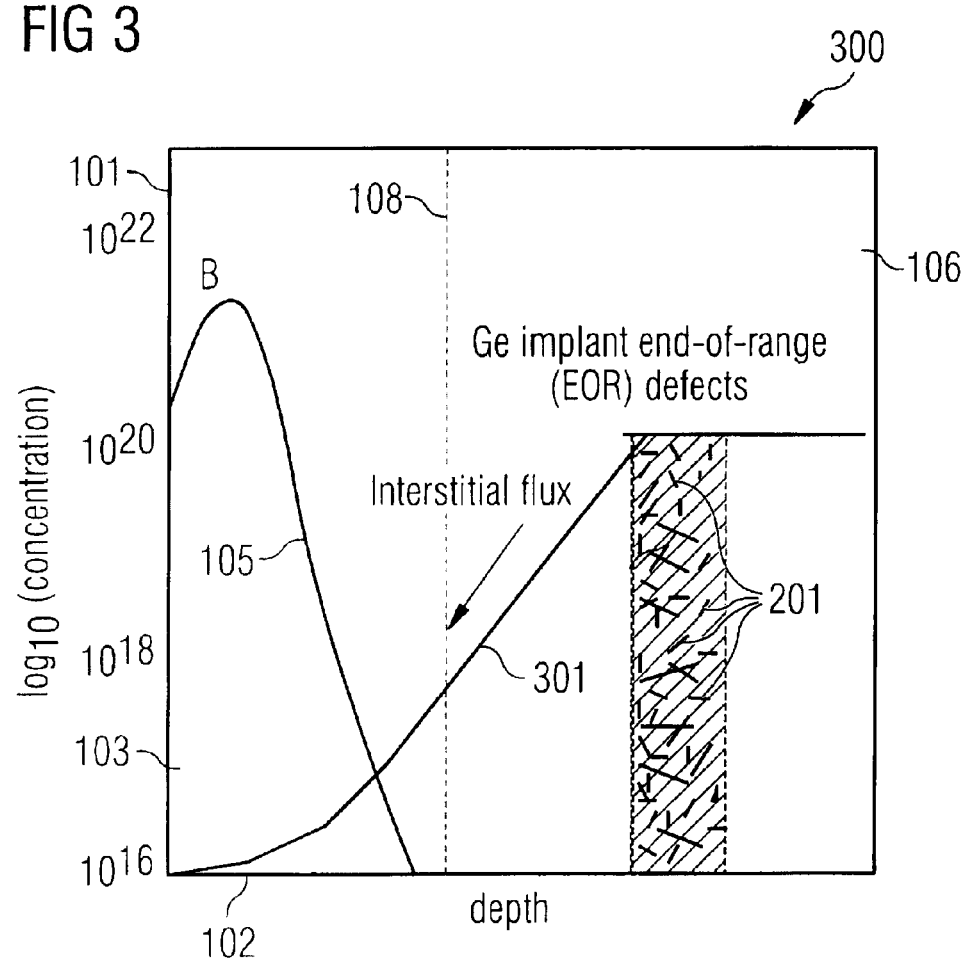
FIG. 3 shows a diagram illustrating a usually occurring flux of interstitials produced in accordance with FIG. 2 in the direction of a region doped with doping atoms.

It should furthermore be noted that the interstitial defects 201 partly diffuse in the direction of the main processing surface of the substrate and thus in the direction of the amorphous region 103 (cf. fourth curve 301 in a third diagram 300 illustrated in FIG. 3).

Figure 4:
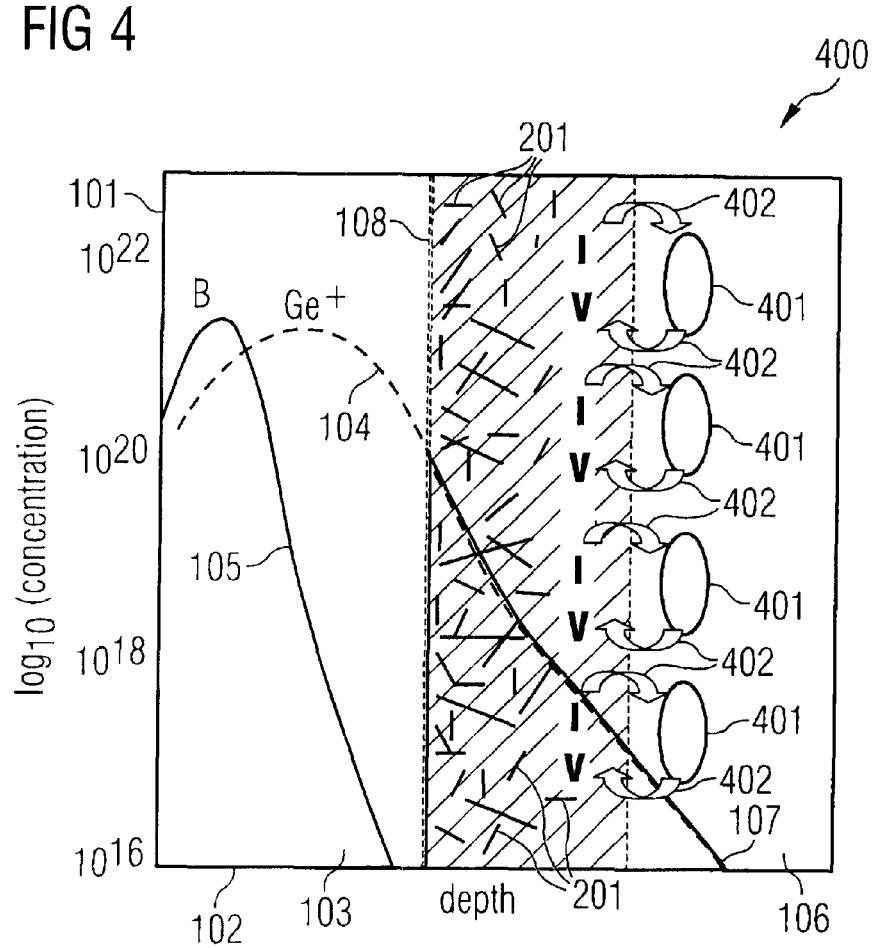
FIG. 4 shows a first diagram illustrating a functional principle in accordance with one embodiment of the invention.

One embodiment of the invention provides, as is illustrated in a fourth diagram 400 in FIG. 4, for forming micro-cavities 401 below the region into which the boron atoms, generally the doping atoms, are introduced into the substrate, in the crystalline region 106, if appropriate below the amorphous region 103 if a region such as the latter is provided. The micro-cavities 401 are formed in the local vicinity of the interstitial defects 201 that are to be expected and are formed later, the micro-cavities 401 being produced so close to the interstitial defects 201 formed later that they serve as a sink for the interstitial defects 201 formed later. To put it another way, the interstitial defects 201 are resolved, to put it in yet another way eliminated, by the micro-cavities 401 (this process is symbolized by arrows 402 in the fourth diagram 400 in FIG. 4). This process is effected in temperature-assisted fashion in the context of rapid thermal annealing (RTA). A very simple standard mechanism is thus used to at least partly eliminate the undesirable interstitial defects 201.

Consequently, laser heating or flash heating is no longer necessary in accordance with this embodiment of the invention. If desired, however, laser heating or flash heating may likewise be used in alternative embodiments of the invention.

Figure 5:
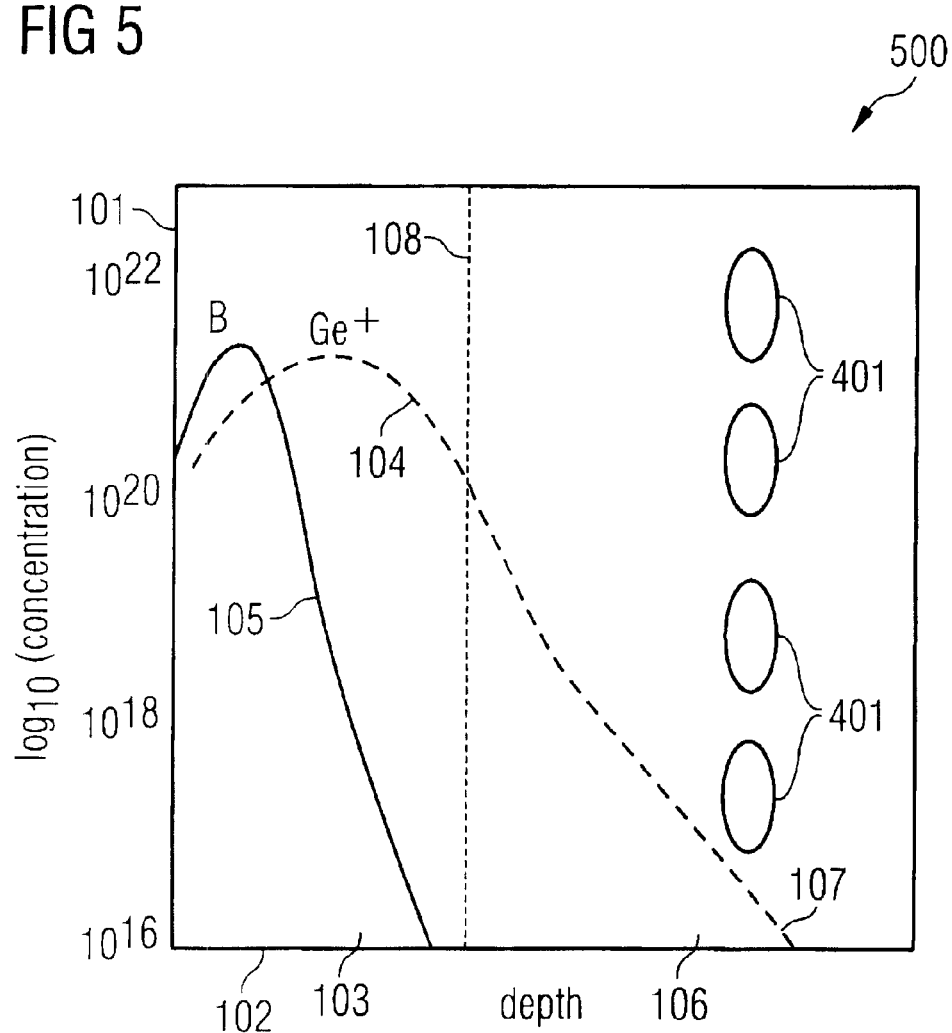
FIG. 5 shows a second diagram illustrating a functional principle in accordance with one embodiment of the invention.

FIG. 5 symbolically illustrates, in a fifth diagram 500, the end state after the interstitial defects 201 have been eliminated, it being assumed that micro-cavities 401 are still present in the substrate even after the elimination of the interstitial defects 201.

FIG. 6A shows one process step of a method for fabricating a field effect transistor in accordance with one exemplary embodiment of the invention.

The implantation of light ions, in this case $H_2^+$ ions 602, into a silicon substrate 601 is shown. The light ions 602 are implanted, by way of example, with an implantation dose $\Phi=10^{16}$ cm$^{-2}$ and an implantation energy E=38 keV. By virtue of the implanted light ions 602, covalent silicon bonds in the substrate 601 are broken and micro-platelets 603 are formed, preferably in a narrow band 604 centered around the concentration maximum, clearly the range (projected range) $R_p$, of the light ions 602. $R_p$ and hence the depth of the band 604 of micro-platelets 603 can be varied by varying the parameters dose $\Phi$ and energy E. The parameters dose $\Phi$ and energy E can be chosen such that the micro-platelets 203 are formed below the channel region 605 of the transistor to be formed.

As shown in FIG. 6A, the micro-platelets 603 are elongated along a plane parallel to the surface 606 of the substrate 601. In the case of a (100) substrate used in accordance with one exemplary embodiment of the invention, the micro-platelets 603 may be elongated e.g. along the (100) plane or the (111) plane, the lengths of the individual micro-platelets 603 being distributed around a statistical mean value, which is illustrated in FIG. 7.

Figure 7:
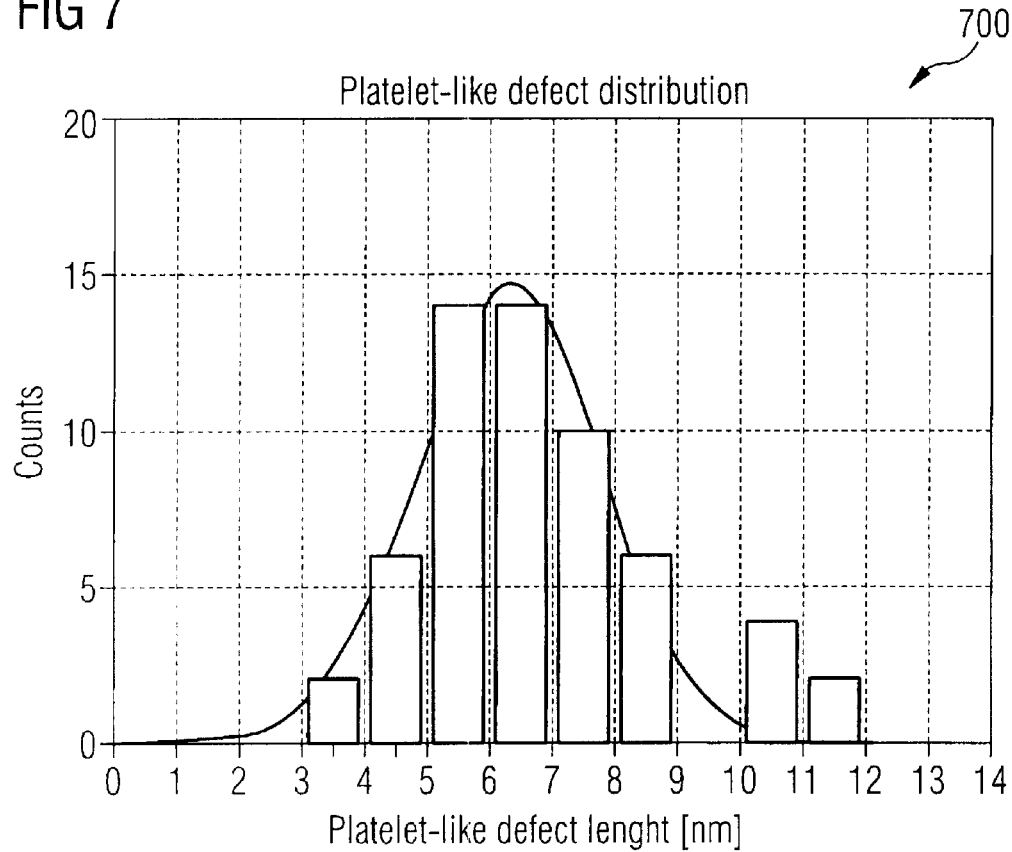
FIG. 7 shows a length distribution of micro-platelets.

FIG. 7 shows a frequency distribution 700 of the lengths of micro-platelets 603 or platelet-like defects which were formed by the implantation of $H_2^+$ ions with an implantation dose $\Phi=1.3\times10^{16}$ cm$^{-2}$ and an implantation energy E=120 keV. The frequency distribution 700 reveals a mean platelet length of approximately 6.5 mm and a standard deviation of the platelet length of approximately 2.3 mm.

If necessary, it is possible to use a hard mask composed of an oxide layer and a nitride layer formed on the oxide layer, which are patterned such that the lateral extent of the region in which the micro-platelets 603 are formed is restricted to the area of the highly doped source/drain regions to be formed, which are formed as an ultra-shallow junction. To put it another way, what is achieved by means of the hard mask is that micro-platelets 603 are formed below the source/drain regions of the field effect transistor. The mask may have a size similar to the desired lateral extent of the source/drain regions.

FIG. 6B shows a further process step of the method for fabricating a field effect transistor in accordance with the exemplary embodiment of the invention. It shows a thermal treatment of the substrate 601 and of the micro-platelets 603 formed, to put it another way a tempering step or annealing step with a temperature T=700° C. and a time duration of t=60 min, i.e. with a low thermal budget, which is applied to the substrate 601 and the micro-platelets 603 formed.

The heating results in an outdiffusion of the implanted $H_2^+$ ions in the form of hydrogen molecules ($H_2$ molecules), and a network or a band of micro-cavities 620' is formed from the micro-platelets 603. The temperature T and the time duration t of the annealing step shown in FIG. 6B are only by way of example and can be optimized to the effect that the density and the size of the micro-cavities 620' formed do not exceed predetermined threshold values, with the result that a delamination of the substrate 601 is avoided.

FIG. 6C shows a micrograph appertaining to cross-sectional transmission electron microscopy (XTEM) 650, in which the micro-cavities 620' formed after the first thermal treatment can be discerned.

FIG. 6D shows a further process step of the method for fabricating a field effect transistor in accordance with the exemplary embodiment of the invention. It shows a second thermal treatment, during which the substrate is heated to a temperature of T=1100° C. for a duration of t=1 s. The second thermal treatment initiates a conservative ripening process of the micro-cavities 620' formed in the substrate 601, in the course of which a small number of large micro-cavities 620 are formed from the large number of relatively small micro-cavities 620'.

FIG. 6E shows an XTEM micrograph 660 of the large micro-cavities 620 formed after the second thermal treatment. The large micro-cavities 620 have a size such that they enclose a volume in a first dimension of between 5 nm and 100 nm, for example of between 10 nm and 100 nm, in a second dimension of between 20 nm and 100 nm and in a third dimension of between 10 nm and 200 nm, for example of between 50 nm and 100 nm.

Figure 8A:
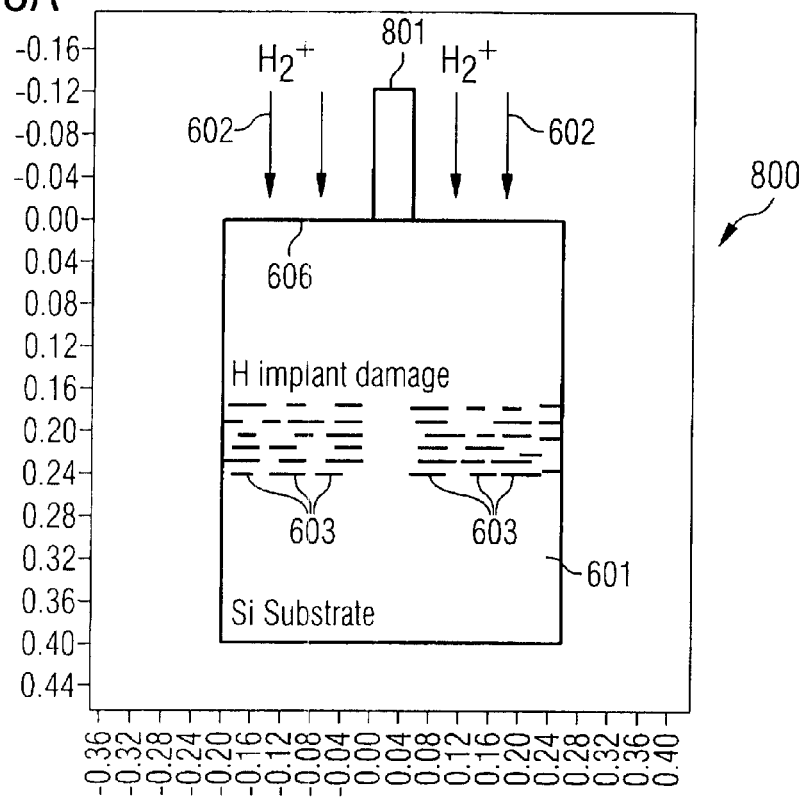
FIG. 8A shows a further process step of the method for fabricating a field effect transistor in accordance with the first embodiment of the invention.

FIG. 8A shows, in a first structure 800, the substrate 601 with the micro-platelets 603, a gate structure 801 having been formed prior to the production of the micro-platelets 603 and hence prior to the implantation of the $H_2^+$ ions 602. The $H_2^+$ ions are implanted with an implantation dose $\Phi=2\times10^{16}$ cm$^{-2}$ and with an implantation energy E=20 keV, alternatively with an implantation dose $\Phi=1.3\times10^{16}$ cm$^{-2}$ and an implantation energy E=120 keV. The gate structure 801 is formed in a manner known per se by means of the main processing surface 606 of the silicon substrate 601 being oxidized and a polysilicon layer being applied thereto. Patterning of the polysilicon layer and the silicon oxide layer results in the formation of the gate structure 801 with a gate oxide and the gate electrode made of polysilicon. The region situated below the gate structure 801 remains free of the $H_2^+$ ions 602 even after the implantation of the latter, since the gate structure 801 serves as a mask in the context of the implantation of the $H_2^+$ ions 602. After the implantation of the $H_2^+$ ions 602, the above-described method for forming the micro-cavities 620 is applied to the substrate 601 with the gate structure 801, so that the structure 810 illustrated in FIG. 8B is formed.

Figure 8B:
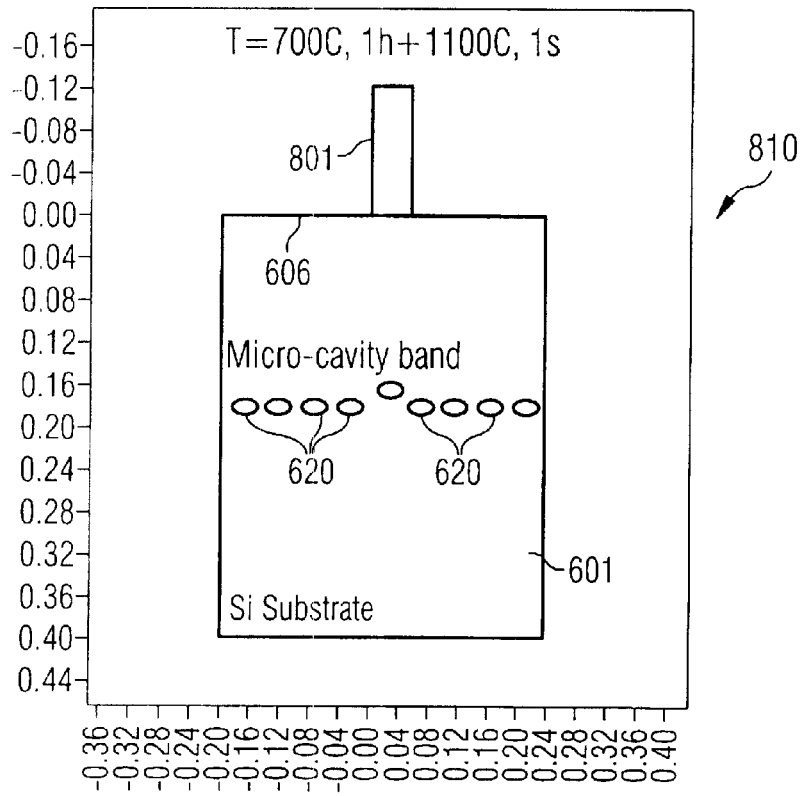
FIG. 8B shows a further process step of the method for fabricating a field effect transistor in accordance with the first embodiment of the invention.
Figure 8C:
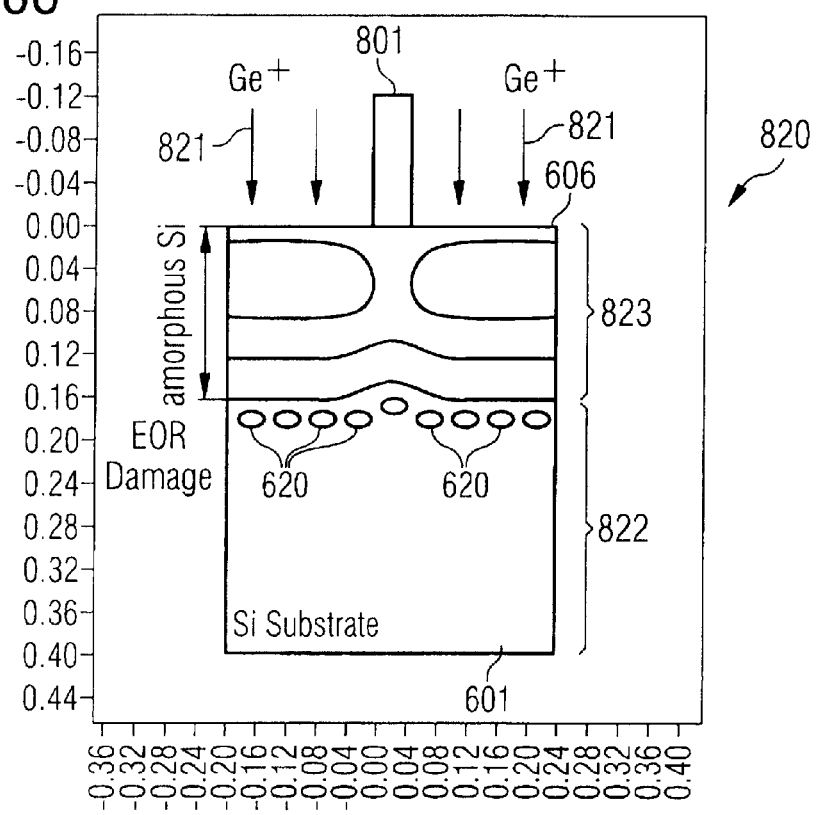
FIG. 8C shows a further process step of the method for fabricating a field effect transistor in accordance with the first embodiment of the invention.

The structure 810 shown in FIG. 8B is amorphized in its surface region as far as a depth of approximately 50 nm to 200 nm, for example as far as a depth of approximately 100 nm, with the introduction of germanium ions Ge$^+$ 821 (cf. structure 820 in FIG. 8C), so that the (100)-silicon substrate 601, which is originally monocrystalline, now has a crystalline region 822 and an amorphous region 823, which approximately extends as far as the micro-cavities 620, an approximate distance between the micro-cavities 620 and the lower boundary of the amorphous region 823 in the depth direction of the substrate 601 being 10 nm to 20 nm. As an alternative, it is also possible to use a (111)-silicon substrate. In accordance with this exemplary embodiment of the invention, the germanium ions 821 are implanted with an implantation dose $\Phi=10^{15}$ cm$^{-2}$ and an implantation energy E=120 keV.

Figure 8D:
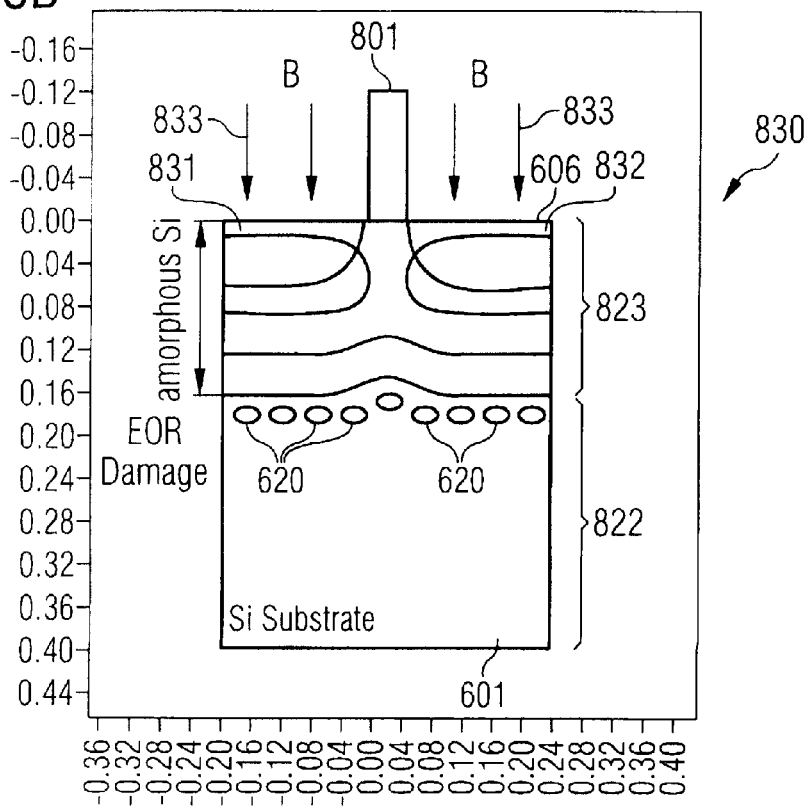
FIG. 8D shows a field effect transistor in accordance with a first embodiment of the invention.

Afterward, using the gate structure 801 as a mask, a source region 831 and a drain region 832 are formed by means of the implantation of boron atoms 833 into the amorphous region 823 alongside the gate structure 801. This completes a field effect transistor 830 (cf. FIG. 8D) having fewer interstitial defects 201 compared with conventional field effect transistors. This means that the TED of boron atoms in the field effect transistor 830 formed is likewise reduced compared with conventional field effect transistors.

Consequently, the process illustrated in FIG. 8A to FIG. 8D involves carrying out the implantation of the $H_2^+$ ions 602 and the heating of the micro-platelets 603 in order to form the micro-cavities 620 prior to the amorphization of the substrate 601.

FIG. 9A to FIG. 9D show a process in accordance with an alternative exemplary embodiment of the invention, this exemplary embodiment of the invention differing from the exemplary embodiment of the invention illustrated in FIG. 8A to FIG. 8D in that the gate structure 801 is not formed until after the micro-cavities 620 have been formed, but the individual method steps themselves are identical to the exemplary embodiment of the invention illustrated in FIG. 8A to FIG. 8D, for which reason a renewed description of these steps in detail is dispensed with.

Figure 9A:
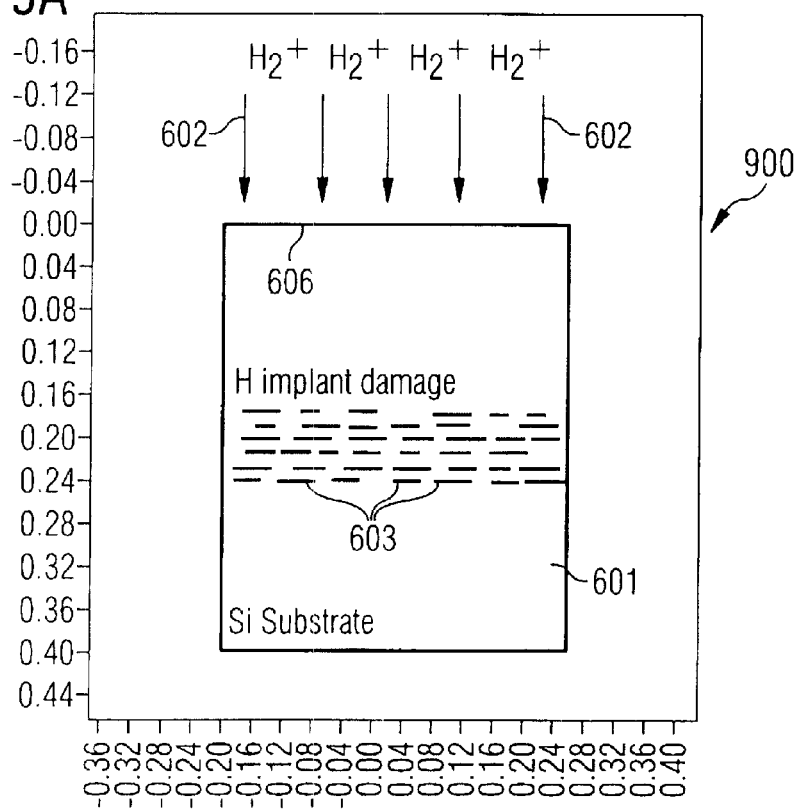
FIG. 9A shows a process step of a method for fabricating a field effect transistor in accordance with a second embodiment of the invention.

As is illustrated in FIG. 9A, $H_2^+$ ions 602 are implanted into the substrate 601, whereby the micro-platelets 603 are formed. Since, in this exemplary embodiment of the invention, a gate structure 801 is not yet present during the implantation of the $H_2^+$ ions 602, a continuous structure of micro-platelets 603 forms in the substrate 601 (cf. structure 900 in FIG. 9A).

Figure 9B:
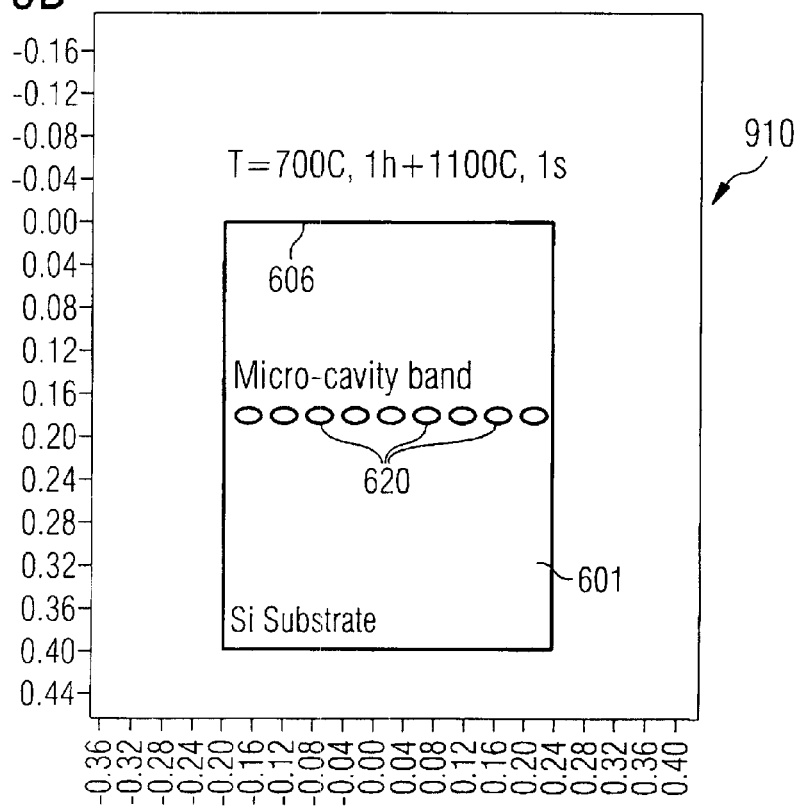
FIG. 9B shows a further process step of the method for fabricating a field effect transistor in accordance with the second embodiment of the invention.
Figure 9C:
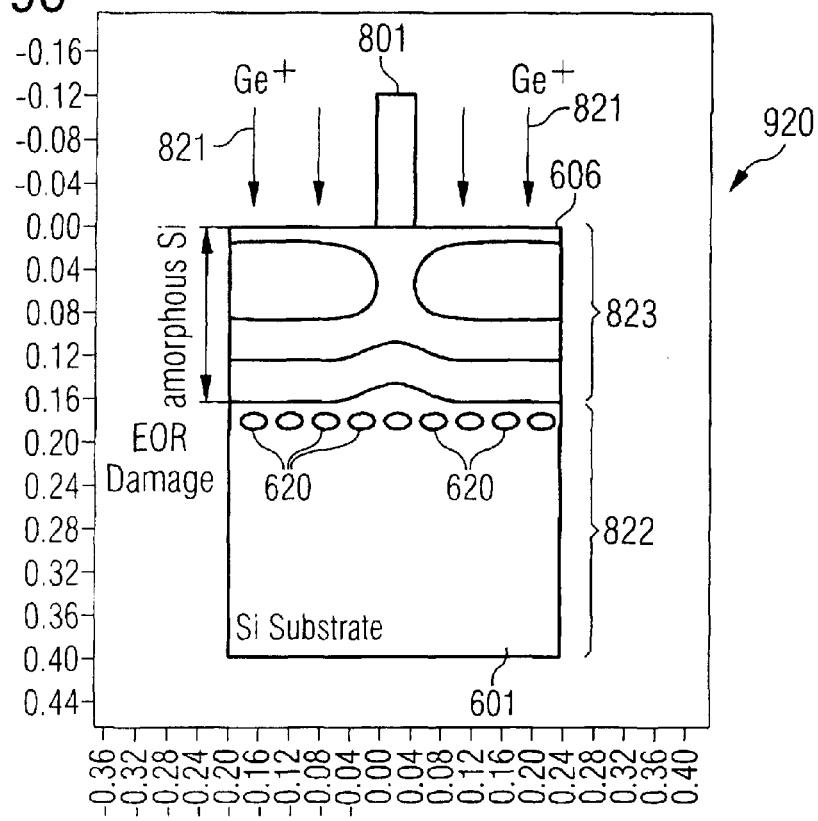
FIG. 9C shows a further process step of the method for fabricating a field effect transistor in accordance with the second embodiment of the invention.
Figure 9D:
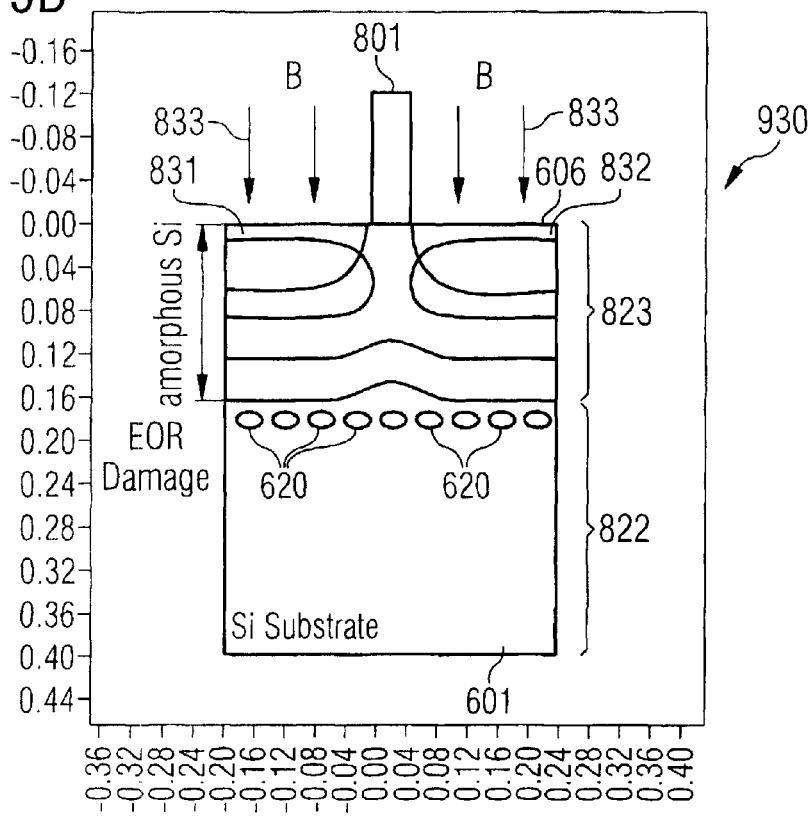
FIG. 9D shows a field effect transistor in accordance with a second embodiment of the invention.

In accordance with the procedure described above, the micro-cavities 620 or the band-type structure of the micro-cavities 620 are formed from the micro-platelets 603 (cf. structure 910 in FIG. 9B).

The gate structure 801 is then formed, for example in the manner set out in connection with FIG. 8A. The substrate 601 is subsequently preamorphized (cf. structure 920 in FIG. 9C).

Afterward, using the gate structure 801 as a mask, once again a source region 831 and a drain region 832 are formed by means of the implantation of boron atoms 833 into the amorphous region 823 alongside the gate structure 801. This completes a field effect transistor 930 (cf. FIG. 9D) having fewer interstitial defects 201 compared with conventional field effect transistors. This means that the TED of boron atoms in the field effect transistor 930 formed is likewise reduced compared with conventional field effect transistors.

Consequently, the process illustrated in FIG. 9A to FIG. 9D involves carrying out the implantation of the $H_2^+$ ions 602 and the heating of the micro-platelets 603 in order to form the micro-cavities 620 prior to gate oxidation.

The following advantages of exemplary embodiments of the invention shall supplementarily be pointed out:

- process sequences are specified which can be integrated into a customary CMOS process in a very simple manner.
- No adverse effect is produced with regard to the performance of the semiconductor element formed, for example the field effect transistor formed, since the micro-cavities formed are at a sufficiently large distance from the $p^+$/n junctions of the ultra-shallow junctions.
- The TED and the deactivation of the doping atoms are considerably reduced as a direct consequence of the reduction of the EOR defects.
- Ultra-fast thermal processes such as, for example, laser heating or flash heating can be carried out at a temperature of less than 1300° C., whereby dielectric degradation problems are avoided.
- Furthermore, it is possible to use rapid thermal annealing (RTA) instead of laser heating or flash heating.

In accordance with one embodiment of the invention, a high implantation dose of light ions ($H_2^+$ ions, $He^+$ ions or $F^+$ ions) which form micro-cavities in a region in which EOR defects are formed is integrated in a conventional CMOS process.

Said micro-cavities remain stable during a gate oxidation process and are subjected for example to a competing ripening process with interstitial-like defects during the high-temperature annealing process (laser or flash annealing). The probability of elimination of interstitial-like defects (such as, for example, dislocation loops or {113} defects) depends both on the density and on the size of the cavities. The larger the micro-cavities, the greater the probability of the dislocation loops being resolved.

The competition between micro-cavities and interstitial-like defects commences at the beginning of the RTP annealing process. Since the surface energy of the micro-cavities is approximately equivalent to the surface energy of the silicon surface, the dislocation loops are energetically less favorable, and a flux of interstitial defects in the direction of the micro-cavity region will commence for this reason.

One embodiment of the invention provides a method for fabricating a semiconductor element, the silicon surface being brought closer to the EOR defects with the aid of the method.

Assuming that the micro-cavities are kept sufficiently far from the pn junctions, an adverse effect of the method on the performance of the semiconductor element is not caused.

Only slight modifications in the process flow of a conventional CMOS process are required. In order to keep the micro-cavity layer away from the junction, the energy of the preamorphization implant should be slightly increased.

Another advantage of a method in accordance with one embodiment of the invention may be seen for example in the fact that the peak heating temperature of the ultra-fast thermal process can be reduced considerably below 1300° C.

One of the reasons for using extremely high temperatures is to reduce TED and to increase the degree of dopant activation.

As already explained, both TED and dopant deactivation are reduced or eliminated by the production of a sink for interstitial defects, and high-temperature processes are no longer required for this reason. This affords a multiplicity of possibilities for selecting the most suitable RTP method.

Although embodiments of the present invention and their advantages have been described in detail, it should be noted that diverse changes, replacements and innovations can be made to them without departing from the essence and scope of the invention as defined by the claims hereinafter. By way of example, it is readily evident to a person skilled in the art that many of the features, functions, processes and materials which are described herein can be altered in such a way that the alterations made still lie within the scope of the present invention. Furthermore, the intention is not to restrict the scope of the present invention to the specific embodiments of the process, of the machine, of the fabrication, of the material composition, of the means, of the methods or steps which are mentioned in the description. As the average person skilled in the art can readily gather from the disclosure of the present invention, it is also possible according to the present invention to utilize processes, machines, fabrication methods, material compositions, means, methods or steps which currently exist or will be developed in the future, and which fulfill essentially the same task or achieve essentially the same result as the corresponding embodiments that have been described here. Accordingly, the intention is for the claims hereinafter to include such processes, machines, fabrication methods, material compositions, means, methods or steps within their scope.

The invention claimed is:

1. A method for fabricating a semiconductor element in a substrate, comprising:
   forming micro-cavities in the substrate;
   implanting preamorphization ions into the substrate to preamorphize a portion of the substrate and produce crystal defects in the substrate;
   implanting doping atoms into the preamorphized portion of the substrate; and
   heating the substrate to eliminate at least some of the crystal defects using the micro-cavities,
   wherein at least one shallow junction of the semiconductor element is formed in the preamorphized portion of the substrate using the doping atoms.

2. The method as claimed in claim 1, wherein the step of forming the micro-cavities comprises:
   forming micro-platelets in the substrate, and
   forming the micro-cavities from the micro-platelets.

3. The method as claimed in claim 2, wherein the micro-platelets are elongated along a plane parallel to the surface of the substrate.

4. The method as claimed in claim 2, wherein the step of forming micro-platelets comprises implanting light ions into the substrate.

5. The method as claimed in claim 2, wherein the step of forming the micro-cavities from the micro-platelets comprises thermally treating the substrate with the micro-platelets.

6. The method as claimed in claim 5, wherein the step thermally treating the substrate with the micro-platelets comprises heating the substrate to a temperature of between 600° C. and 800° C.

7. The method as claimed in claim 6, wherein the step thermally treating the substrate with the micro-platelets comprises heating the substrate for a duration of between 10 minutes and 2 hours.

8. The method as claimed in claim 5, further comprising thermally treating the substrate a second time to form the micro-cavities by a ripening process.

9. The method as claimed in claim 8, wherein the step thermally treating the substrate a second time comprises heating the substrate to a temperature of between 1000° C. and 1300° C.

10. The method as claimed in claim 9, wherein the step thermally treating the substrate a second time comprises heating the substrate for a duration of between 1 microsecond and 1 second.

11. The method as claimed in claim 1, wherein the step of forming micro-cavities comprises implanting light ions into the substrate.

12. The method as claimed in claim 11, wherein the light ions are at least one of the types of light ions selected from the group consisting of $H_2^+$ ions, $He^+$ ions, $F^+$ ions, $Ne^+$ ions, $Cl^+$ ions, and $Ar^+$ ions.

13. The method as claimed in claim 11, wherein the step of implanting the light ions comprises implanting a light ion dose of between $10^{15}$ cm$^{-2}$ and $10^{18}$ cm$^{-2}$.

14. The method as claimed in claim 11, wherein the step of implanting the light ions comprises implanting the light ions such that they have an energy of between 10 keV and 150 keV during the implantation.

15. The method as claimed in claim 1, wherein the preamorphization ions are implanted into the substrate after the micro-cavities are formed.

16. The method as claimed in claim 1, wherein the preamorphization ions are germanium ions or silicon ions.

17. The method as claimed in claim 1, wherein the doping atoms are boron atoms, phosphorus atoms, or arsenic atoms.

18. The method as claimed in claim 17, wherein the boron atoms are implanted into the substrate by introducing elementary boron into the substrate, or by introducing boron fluoride into the substrate, or by introducing boron clusters into the substrate.

19. The method as claimed in claim 1, wherein the semiconductor element is a transistor.

20. The method as claimed in claim 19, wherein the semiconductor element is a field effect transistor.

21. The method as claimed in claim 20, wherein at least one region in which the doping atoms are implanted into the substrate forms a source region or a drain region of the field effect transistor.

22. The method as claimed in claim 21,
   wherein a first region in which the doping atoms are implanted into the substrate forms a source region, and
   wherein a second region in which the doping atoms are implanted into the substrate forms a drain region of the field effect transistor.

23. The method as claimed in claim 20, further comprising forming the gate insulator of the field effect transistor after the formation of the micro-cavities.

24. The method as claimed in claim 1, wherein the substrate is a silicon substrate.

25. The method as claimed in claim 24, wherein the substrate is a (100)-silicon substrate or a (111)-silicon substrate.

26. A method for fabricating a semiconductor element in a substrate, comprising:
   forming micro-cavities in the substrate by implanting light ions into the substrate;
   implanting preamorphization ions into the substrate to preamorphize a portion of the substrate and produce crystal defects in the substrate;
   implanting doping atoms into the preamorphized portion of the substrate; and
   heating the substrate to eliminate at least some of the crystal defects using the micro-cavities,
   wherein at least one shallow junction of the semiconductor element is formed in the preamorphized portion of the substrate using the doping atoms.

* * * * *